(12) United States Patent
Ikeda

(10) Patent No.: US 11,233,394 B2
(45) Date of Patent: Jan. 25, 2022

(54) ELECTROSTATIC PROTECTION CIRCUIT

(71) Applicant: Seiko Epson Corporation, Tokyo (JP)

(72) Inventor: Masuhide Ikeda, Matsumoto (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/941,653

(22) Filed: Jul. 29, 2020

(65) Prior Publication Data
US 2021/0036513 A1 Feb. 4, 2021

(30) Foreign Application Priority Data

Jul. 30, 2019 (JP) .............................. JP2019-139496

(51) Int. Cl.
*H02H 9/04* (2006.01)
(52) U.S. Cl.
CPC .................................. *H02H 9/046* (2013.01)
(58) Field of Classification Search
CPC ............................ H02H 9/046; H01L 27/0262
USPC ........................................................ 361/56
See application file for complete search history.

(56) References Cited

U.S. PATENT DOCUMENTS

| | | | |
|---|---|---|---|
| 5,272,097 A | 12/1993 | Shiota | |
| 5,426,322 A | 6/1995 | Shiota | |
| 5,591,661 A | 1/1997 | Shiota | |
| 5,895,940 A * | 4/1999 | Kim | H01L 27/0262 257/173 |
| 6,512,662 B1 * | 1/2003 | Wang | H01L 27/0251 361/56 |
| 8,218,276 B2 * | 7/2012 | Mallikarjunaswamy | H01L 27/0262 361/56 |
| 8,611,058 B2 * | 12/2013 | Fan | H02H 9/046 361/56 |
| 9,812,437 B2 * | 11/2017 | Kakubari | H01L 27/0292 |
| 9,935,096 B2 * | 4/2018 | Ikeda | H01L 27/0635 |
| 10,062,682 B1 * | 8/2018 | Mallikarjunaswamy | H01L 23/535 |
| 10,396,551 B2 * | 8/2019 | Ikeda | H02H 9/046 |

(Continued)

FOREIGN PATENT DOCUMENTS

| | | |
|---|---|---|
| JP | H06-125048 A | 5/1994 |
| JP | 2017-054864 A | 3/2017 |

*Primary Examiner* — Dharti H Patel
(74) *Attorney, Agent, or Firm* — Harness, Dickey & Pierce, P.L.C.

(57) ABSTRACT

An electrostatic protection circuit that is electrically connected to a first terminal to which a first voltage signal is input, a second terminal to which a second voltage signal is input, and a connection terminal that is connected to an external circuit, and mitigates the influence of a surge voltage on an internal circuit, the electrostatic protection circuit including: a first protection circuit that is electrically connected to the first terminal and the second terminal; and a second protection circuit that is electrically connected to the first terminal and the connection terminal, and the second protection circuit including: a first diode element whose anode is electrically connected to the connection terminal, and whose cathode is electrically connected to the first terminal, a thyristor element whose cathode is electrically connected to the connection terminal, a voltage limiting element that is electrically connected to an anode of the thyristor element, and a trigger element that is electrically connected to a gate of the thyristor element, and causes the thyristor element to operate.

6 Claims, 8 Drawing Sheets

(56) References Cited

U.S. PATENT DOCUMENTS

| | | | |
|---|---|---|---|
| 2009/0122452 A1* | 5/2009 | Okushima | H01L 27/0262 |
| | | | 361/56 |
| 2011/0019319 A1* | 1/2011 | Okushima | H01L 27/0262 |
| | | | 361/56 |
| 2012/0170160 A1* | 7/2012 | Wang | H01L 27/0262 |
| | | | 361/56 |
| 2015/0029622 A1* | 1/2015 | Su | H01L 27/0262 |
| | | | 361/56 |
| 2019/0319454 A1* | 10/2019 | Sithanandam | H01L 27/0255 |

* cited by examiner

ELECTROSTATIC PROTECTION CIRCUIT

The present application is based on, and claims priority from JP Application Serial Number 2019-139496, filed Jul. 30, 2019, the disclosure of which is hereby incorporated by reference herein in its entirety.

BACKGROUND

1. Technical Field

The present invention relates to an electrostatic protection circuit.

2. Related Art

When a surge voltage such as an electrostatic voltage is applied to an integrated circuit device, an overvoltage and an overcurrent occur in the integrated circuit device due to the surge voltage, and, as a result, there is a risk that an internal circuit of the integrated circuit device will malfunction. Accordingly, there are known techniques for mitigating the risk that an integrated circuit device will malfunction, by providing, in the integrated circuit device, an electrostatic protection circuit for protecting an internal circuit against a surge voltage such as an electrostatic voltage, and protecting the internal circuit against a surge voltage using the electrostatic protection circuit.

For example, Patent Document 1 discloses an electrostatic protection circuit (ESD protection circuit) that is a protection circuit including three or more external terminals to which an ESD (Electro Static Discharge) voltage can be applied, diodes provided in correspondence with the three or more external terminals, and a common node to which the diodes are commonly connected, and, in the electrostatic protection circuit, the diodes are provided on current paths between the common node and the external terminals corresponding to the diodes, such that a forward current flows from the external terminals to the common node.

In addition, Patent Document 2 discloses an electrostatic protection circuit (output protection circuit) that includes diodes provided respectively between a VDD line through which a positive power supply VDD is propagated and a terminal to which a signal is input from the outside or a terminal that outputs a signal to the outside and between the VDD line and a VSS line through which a negative power supply VSS is propagated.

JP-A-2017-054864 and JP-A-6-125048 are examples of the related art.

However, in each of the electrostatic protection circuits described in Patent Document 1 and Patent Document 2, a voltage value to which a surge voltage is limited by the electrostatic protection circuit is determined based on breakdown voltages of a plurality of diodes that constitute the electrostatic protection circuit, and thus a voltage value to which a surge voltage in the electrostatic protection circuit is limited increases, and, as a result, the difference between the voltage value of a break voltage at which there is a risk that breakdown will occur in the integrated circuit apparatus and a voltage value to which a surge voltage is limited in the electrostatic protection circuit decreases. Therefore, there is a risk that the influence of a surge voltage cannot be sufficiently mitigated depending on the waveform and value of a surge voltage that is applied to the integrated circuit device, and there is room for improvement.

SUMMARY

An electrostatic protection circuit according an aspect of the present disclosure is electrically connected to a first terminal to which a first voltage signal is input, a second terminal to which a second voltage signal whose potential is lower than that of the first voltage signal is input, and a connection terminal that is connected to an external circuit, and mitigates the influence of a surge voltage on an internal circuit, the electrostatic protection circuit including:

a first protection circuit that is electrically connected to the first terminal and the second terminal; and a second protection circuit that is electrically connected to the first terminal and the connection terminal, and the second protection circuit includes:

a first diode element whose anode is electrically connected to the connection terminal, and whose cathode is electrically connected to the first terminal, a thyristor element whose cathode is electrically connected to the connection terminal, a voltage limiting element that is electrically connected to an anode of the thyristor element, and a trigger element that is electrically connected to a gate of the thyristor element, and causes the thyristor element to operate.

The electrostatic protection circuit according to another aspect may include:

a resistive element whose one end is electrically connected to the connection terminal, and whose other end is electrically connected to the internal circuit;

a second diode element whose anode is electrically connected to the other end of the resistive element, and whose cathode is electrically connected to the first terminal; and a third diode element whose anode is electrically connected to the second terminal, and whose cathode is electrically connected to the other end of the resistive element.

The electrostatic protection circuit according to another aspect may include:

a resistive element whose one end is electrically connected to the connection terminal;

an NMOS transistor whose drain is electrically connected to another end of the resistive element, whose source is electrically connected to the internal circuit, and whose gate is electrically connected to the first terminal;

a second diode element whose anode is electrically connected to the source of the NMOS transistor, and whose cathode is electrically connected to the first terminal; and a third diode element whose anode is electrically connected to the second terminal, and whose cathode is electrically connected to the other end of the resistive element.

The electrostatic protection circuit according to another aspect may include:

a resistive element whose one end is electrically connected to the connection terminal;

a PMOS transistor whose drain is electrically connected to another end of the resistive element, whose source is electrically connected to the internal circuit, and whose gate is electrically connected to the second terminal;

a second diode element whose anode is electrically connected to the source of the PMOS transistor, and whose cathode is electrically connected to the first terminal; and a third diode element whose anode is electrically connected to the second terminal, and whose cathode is electrically connected to the drain of the PMOS transistor.

In an electrostatic protection circuit according to one aspect of the present disclosure that is electrically connected to a first terminal to which a first voltage signal is input, a second terminal to which a second voltage signal whose potential is lower than that of the first voltage signal is input, and a third terminal to which a third voltage signal whose potential is lower than that of the first voltage signal, and higher than that of the second voltage signal is input, and that mitigates the influence of a surge voltage on an internal circuit, the internal circuit is electrically connected to the first terminal and the third terminal, the electrostatic protection circuit includes:

a first protection circuit that is electrically connected to the first terminal and the second terminal, and a second protection circuit that is electrically connected to the first terminal and the third terminal, and the second protection circuit includes:

a first diode element whose anode is electrically connected to the third terminal, and whose cathode is electrically connected to the first terminal, a thyristor element whose cathode is electrically connected to the third terminal, a voltage limiting element that is electrically connected to an anode of the thyristor element, and a trigger element that is electrically connected to a gate of the thyristor element, and causes the thyristor element to operate.

In the electrostatic protection circuit according to another aspect, the thyristor element may include:

a first impurity-doped region provided on a substrate, and a second impurity-doped region provided in the first impurity-doped region, the anode of the thyristor element may be provided in the first impurity-doped region, and the cathode of the thyristor element may be provided in the second impurity-doped region.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, preferable embodiments of the disclosure will be described using the drawings. The drawings to be used are merely for description. Note that the embodiments given below are not intended to unduly limit the scope of the disclosure recited in the appended claims. In addition, not all of the constituent elements described below are essential to the disclosure. Note that a description will be given below taking an integrated circuit device provided with an electrostatic protection circuit of the present disclosure, as an example.

1. First Embodiment

Configuration of Integrated Circuit Device

Figure 1:
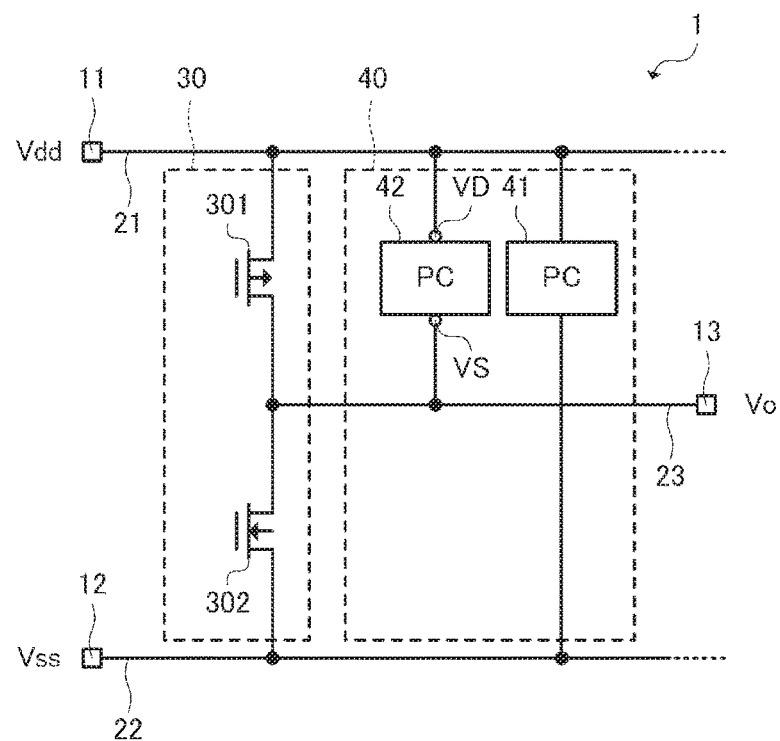
FIG. 1 is a diagram showing the configuration of an integrated circuit device provided with an electrostatic protection circuit.

FIG. 1 is a diagram showing the configuration of an integrated circuit device 1 that includes an electrostatic protection circuit 40, according to a first embodiment. As shown in FIG. 1, the integrated circuit device 1 includes terminals 11, 12, and 13, an internal circuit 30, and the electrostatic protection circuit 40. In the integrated circuit device 1 according to the first embodiment, various constituent elements of the integrated circuit device 1 that include the internal circuit 30 operate based on the difference in potential between a voltage signal Vdd that is input to the terminal 11 and a voltage signal Vss that is input to the terminal 12, the potential of the voltage signal Vss being lower than that of the voltage signal Vdd. In addition, the integrated circuit device 1 outputs, from the terminal 13, a voltage signal Vo that is based on such an operation. The electrostatic protection circuit 40 is electrically connected to the terminal 11 to which the voltage signal Vdd is input, the terminal 12 to which the voltage signal Vss whose potential is lower than that of the voltage signal Vdd is input, and the terminal 13 that is connected to an external circuit of the integrated circuit device 1. The electrostatic protection circuit 40 mitigates the influence of a surge voltage on the internal circuit 30. Note that, in the following description, a high-level logic signal may be simply referred to as an "H level signal", and a low-level logic signal may be simply referred to as an "L level signal". Here, a surge voltage is a voltage generated due to electrostatic or the like, and is a voltage that differs largely in potential from the signal Vdd and the voltage signal Vss. In the following description, a surge voltage that is sufficiently larger than the potential of the voltage signal Vdd may be referred to as a "positive surge voltage", and a surge voltage that is sufficiently smaller than the potential of the voltage signal Vss may be referred to as a "negative surge voltage". In addition, the external circuit is one of various circuits, in various electronic apparatuses in which the integrated circuit device 1 is provided, for controlling operations of the electronic apparatuses, and the various circuits include a circuit that inputs various signals to the integrated circuit device 1, or a circuit that operates based on a signal output from the integrated circuit device 1.

Here, the voltage signal Vdd is an example of a first voltage signal, and the terminal 11 to which the voltage signal Vdd is input is an example of a first terminal. Also, the voltage signal Vss is an example of a second voltage signal, and the terminal 12 to which the voltage signal Vss is input is an example of a second terminal. In addition, the terminal 13 that outputs the voltage signal Vo is an example of a connection terminal.

The internal circuit 30 includes transistors 301 and 302. A description will be given assuming that the transistor 301 according to this embodiment is a P-channel MOS transistor, and the transistor 302 is an N-channel MOS transistor. The source of the transistor 301 is electrically connected to the terminal 11 via a propagation node 21. Also, the drain of the transistor 301 is electrically connected to the drain of the transistor 302. The source of the transistor 302 is electrically connected to the terminal 12 via a propagation node 22. In addition, a connection point at which the drain of the transistor 301 and the drain of the transistor 302 are electrically connected is electrically connected to the terminal 13 via a propagation node 23.

In addition, an H-level or L-level signal that is based on an operation of the integrated circuit device 1 is input to the gates of the transistors 301 and 302. When an H-level signal is input to the gates of the transistors 301 and 302, control is performed so as to switch off the transistor 301 and switch on the transistor 302. Therefore, the internal circuit 30 outputs a signal whose potential is based on the voltage signal Vss, as the voltage signal Vo from the terminal 13. On the other hand, when an L-level signal is input to the gates of the transistors 301 and 302, control is performed so as to switch on the transistor 301 and switch off the transistor 302. Therefore, the internal circuit 30 outputs a signal whose potential is based on the voltage signal Vdd, as the voltage signal Vo from the terminal 13.

Accordingly, in the integrated circuit device 1 according to the first embodiment, the internal circuit 30 functions as an output circuit that outputs a signal that is based on the operation of the integrated circuit device 1, and the terminal 13 functions as an output terminal that outputs the voltage signal Vo as a signal that is based on the operation of the integrated circuit device 1.

The electrostatic protection circuit 40 includes protection circuits 41 and 42.

One end of the protection circuit 41 is electrically connected to the propagation node 21 electrically connected to the terminal 11, and the other end is electrically connected to the propagation node 22 electrically connected to the terminal 12. In other words, the protection circuit 41 is electrically connected to the terminal 11 and the terminal 12. When a surge voltage such as an electrostatic voltage is input to the integrated circuit device 1, the protection circuit 41 limits the difference in potential between the terminal 11 and the terminal 12 to a predetermined value.

Note that the difference in potential between the terminal 11 and the terminal 12 when it is limited by the protection circuit 41 is set larger than or equal to a maximum operation voltage, which is the maximum value of a voltage value at which the integrated circuit apparatus 1 operates, and smaller than or equal to a break voltage of the internal circuit 30. Specifically, the difference in potential between the terminal 11 and the terminal 12 that is limited by the protection circuit 41 is set to a value that is larger than or equal to the maximum operation voltage of the integrated circuit apparatus 1, and is smaller than the sum of the voltage value of the smaller of a breakdown voltage of the transistor 301 of the internal circuit 30 and a breakdown voltage of a parasite diode included in the transistor 301 and the voltage value of the smaller of a breakdown voltage of the transistor 302 of the internal circuit 30 and a breakdown voltage of a parasite diode included in the transistor 302. Here, the protection circuit 41 may have any configuration that makes it possible to limit the difference in potential between the terminal 11 and the terminal 12 to a predetermined value, and may include, for example, a diode whose anode is electrically connected to the terminal 12, and whose cathode is electrically connected to the terminal 11. This protection circuit 41 is an example of a first protection circuit. Here, in the following description, in the protection circuit 41, a path extending from the propagation node 22 toward the propagation node 21 may be referred to as the forward path of the protection circuit 41, and a path extending from the propagation node 21 toward the propagation node 22 may be referred to as the reverse path of the protection circuit 41. Also, in the protection circuit 41, the difference in potential on the forward path may be referred to as a "forward voltage of the protection circuit 41", and the difference in potential on the reverse path may be referred to as a "reverse voltage" of the protection circuit 41.

One end of a protection circuit 42 is electrically connected to the propagation node 21 electrically connected to the terminal 11, and the other end is electrically connected to the propagation node 23 electrically connected to the terminal 13. In other words, the protection circuit 42 is electrically connected to the terminal 11 and the terminal 13. The protection circuit 42 operates when the difference in potential between the propagation node 21 and the propagation node 23 exceeds a predetermined value. As a result of the protection circuit 42 operating, the difference in potential between the propagation node 21 and the propagation node 23 is limited to the predetermined value. Here, the difference in potential at which the protection circuit 42 operates is set to a value smaller than the breakdown voltage of the transistor 301 of the internal circuit 30 and the breakdown voltage of the parasite diode included in the transistor 301. This protection circuit 42 is an example of a second protection circuit.

Configuration of Protection Circuit 42

Figure 2:
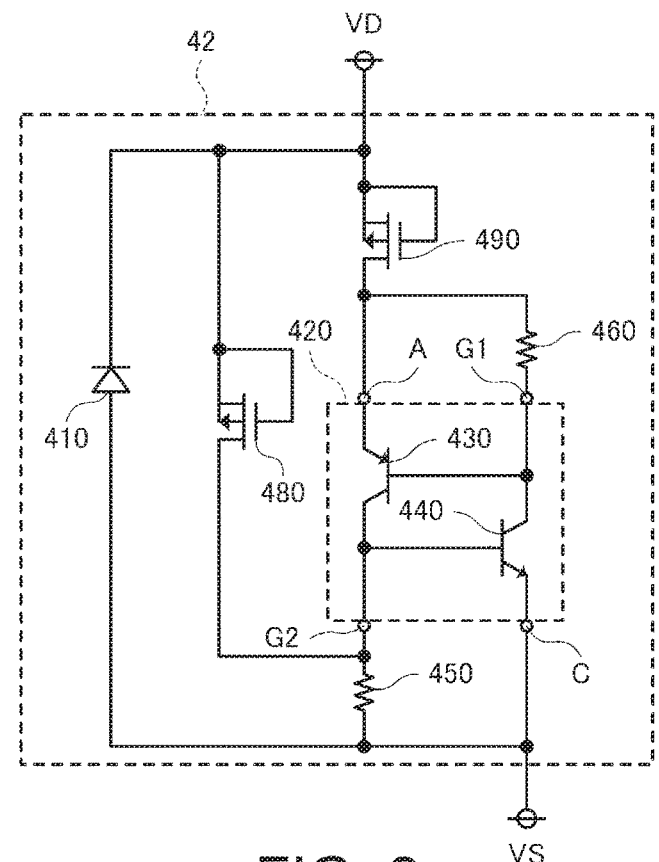
FIG. 2 is a diagram showing an example of the configuration of a protection circuit.

Next, an example of the configuration of the protection circuit 42 will be described with reference to FIG. 2. Here, the terminal VD shown in FIG. 2 is equivalent to the terminal VD that is one end of the protection circuit 42 shown in FIG. 1, and a terminal VS shown in FIG. 2 is equivalent to the terminal VS that is the other end of the protection circuit 42 shown in FIG. 1. Accordingly, the protection circuit 42 is electrically connected to the propagation node 21 via the terminal VD, and is electrically connected to the propagation node 23 via the terminal VS.

FIG. 2 is a diagram showing an example of the configuration of the protection circuit 42. As shown in FIG. 2, the protection circuit 42 includes a diode 410, a thyristor 420, resistors 450 and 460, and transistors 480 and 490. Specifically, the protection circuit 42 includes the diode 410 whose anode is electrically connected to the terminal 13, and whose cathode is electrically connected to the terminal 11, the thyristor 420 with a cathode terminal C electrically connected to the terminal 13, the transistor 490 electrically connected to an anode terminal A of the thyristor 420, and the transistor 480 that is electrically connected to a second gate terminal G2 of the thyristor 420, and causes the thyristor 420 to operate.

To be specific, the anode of the diode 410 is electrically connected to the terminal 13 via the terminal VS and the propagation node 23, and the cathode of the diode 410 is electrically connected to the terminal 11 via the terminal VD and the propagation node 21. This diode 410 included in the protection circuit 42 is an example of a first diode element.

The thyristor 420 includes transistors 430 and 440. The transistor 430 is a PNP transistor, and the transistor 440 is an NPN transistor. The emitter of the transistor 430 is electrically connected to the anode terminal A of the thyristor 420. The base of the transistor 430 is electrically connected to the collector of the transistor 440 and a first gate terminal G1 of the thyristor 420. The collector of the transistor 430 is electrically connected to the base of the transistor 440 and the second gate terminal G2 of the thyristor 420. The emitter of the transistor 440 is electrically connected to the cathode terminal C of the thyristor 420. Also, the cathode terminal C of the thyristor 420 is electrically connected to the terminal VS of the protection circuit 42.

When a signal for causing the thyristor 420 to operate is input to the first gate terminal G1 or the second gate terminal G2, control is performed so as to switch on the thyristor 420 configured as described above. This thyristor 420 included in the protection circuit 42 is an example of a thyristor element, the anode terminal A is an example of the anode of the thyristor 420, the cathode terminal C is an example of the cathode of the thyristor 420, and the second gate terminal G2 is an example of the gate of the thyristor 420.

One end of the resistor 450 is electrically connected to the second gate terminal G2 of the thyristor 420, and the other end is electrically connected to the terminal VS. Also, one end of the resistor 460 is electrically connected to the anode terminal A of the thyristor 420, and the other end is electrically connected to the first gate terminal G1 of the thyristor 420.

The gate and source of the transistor 480 are electrically connected to the terminal VD, and the drain of the transistor 480 is electrically connected to the second gate terminal G2 of the thyristor 420. In addition, the gate and source of the transistor 490 are electrically connected to the terminal VD, and the drain of the transistor 490 is electrically connected to the anode terminal A of the thyristor 420. Note that a description will be given assuming that the transistors 480 and 490 according to this embodiment are P-channel MOS transistors. Here, the transistor 480 included in the protection circuit 42 is an example of a trigger element, and the transistor 490 is an example of a voltage limiting element.

Here, in the following description, a path extending from the terminal VS toward the terminal VD may be referred to as a "forward path" in the protection circuit 42, and a path extending from the terminal VD toward the terminal VS may be referred to as a "reverse path" in the protection circuit 42, in accordance with the orientation of the diode 410 included in the protection circuit 42. Also, in the protection circuit 42, the difference in potential between the terminal VS and the terminal VD on the forward path may be referred to as a "forward voltage" of the protection circuit 42 and the difference in potential between the terminal VD and the terminal VS on the reverse path may be referred to as a "reverse voltage" of the protection circuit 42.

Operations of Electrostatic Protection Circuit

Operations of the electrostatic protection circuit 40 when a surge voltage such as an electrostatic voltage is generated in the integrated circuit apparatus 1 configured as described above will be described with reference to FIGS. 3 to 8.

Figure 3:
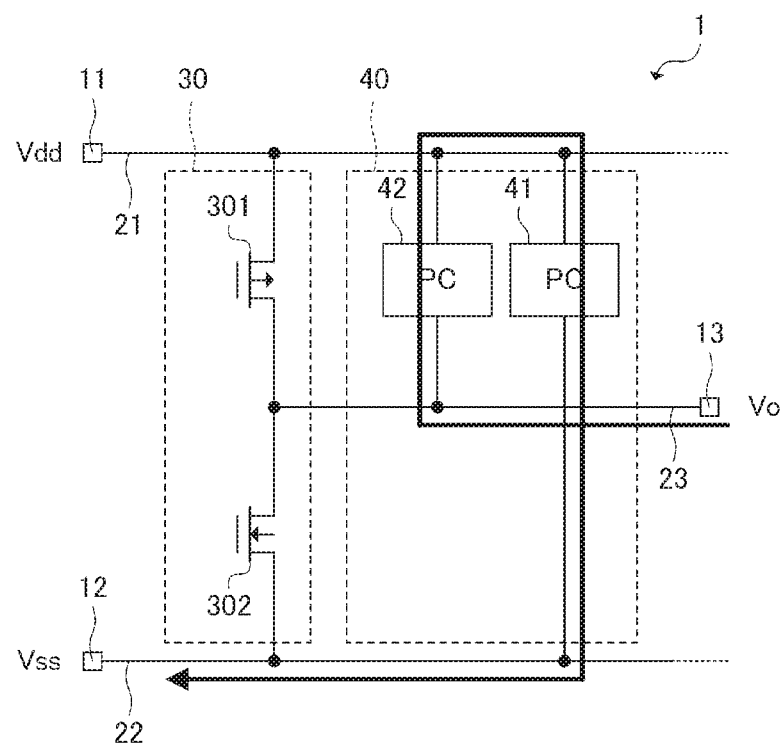
FIG. 3 is a diagram for illustrating a path through which a current caused by a positive surge voltage flows.

FIG. 3 is a diagram for illustrating a path through which a current caused by a positive surge voltage flows, the positive surge voltage having been generated in the terminal 13 when the potential of the voltage signal Vss that is input to the terminal 12 is a ground potential. If a positive surge voltage whose potential is sufficiently larger than that of the voltage signal Vdd is generated in the terminal 13 when the potential of the voltage signal Vss that is input to the terminal 12 is a ground potential, a current caused by the surge voltage flows via the forward path of the protection circuit 42 and the reverse path of the protection circuit 41 in a direction from the terminal 13 toward the terminal 12. Thus, the potential of the terminal 13 is determined based on the sum of the forward voltage of the protection circuit 42 and the reverse voltage of the protection circuit 41. Therefore, the internal circuit 30 can be protected by making the sum of the forward voltage of the protection circuit 42 and the reverse voltage of the protection circuit 41 smaller than the break voltages of the transistors 301 and 302.

Figure 4:
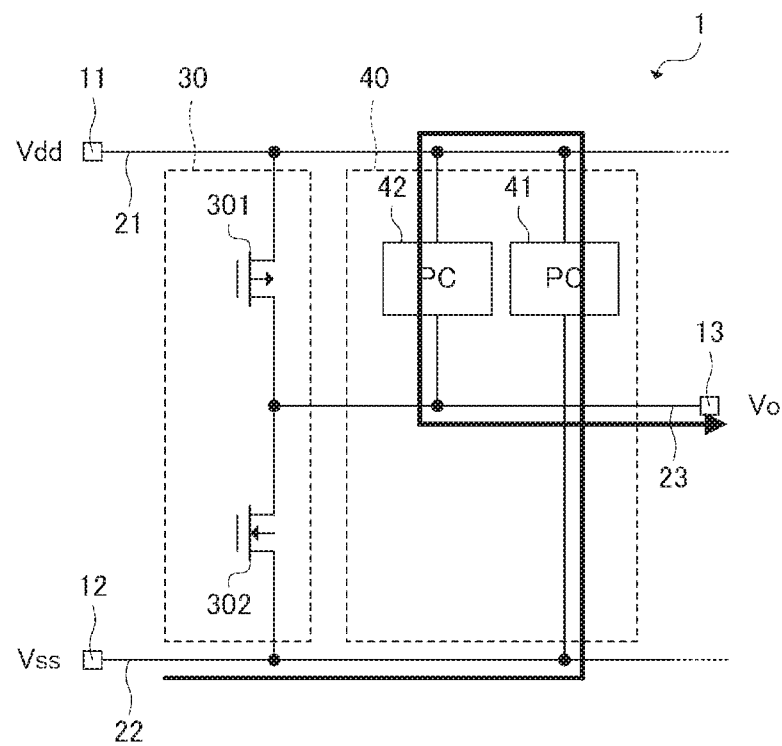
FIG. 4 is a diagram for illustrating a path through which a current caused by a negative surge voltage flows.

FIG. 4 is a diagram for illustrating a path through which a current caused by a negative surge voltage flows, the negative surge voltage having been generated in the terminal 13 when the potential of the voltage signal Vss that is input to the terminal 12 is a ground potential. If a negative surge voltage whose potential is sufficiently smaller than the voltage signal Vss is generated in the terminal 13 when the potential of the voltage signal Vss that is input to the terminal 12 is a ground potential, a current caused by the surge voltage flows via the forward path of the protection circuit 41 and the reverse path of the protection circuit 42 in a direction from the terminal 12 toward the terminal 13. Thus, the potential of the terminal 13 is determined based on the sum of the forward voltage of the protection circuit 41 and the reverse voltage of the protection circuit 42. Therefore, the internal circuit 30 can be protected by making the sum of the forward voltage of the protection circuit 41 and the reverse voltage of the protection circuit 42 smaller than the break voltages of the transistors 301 and 302.

Figure 5:
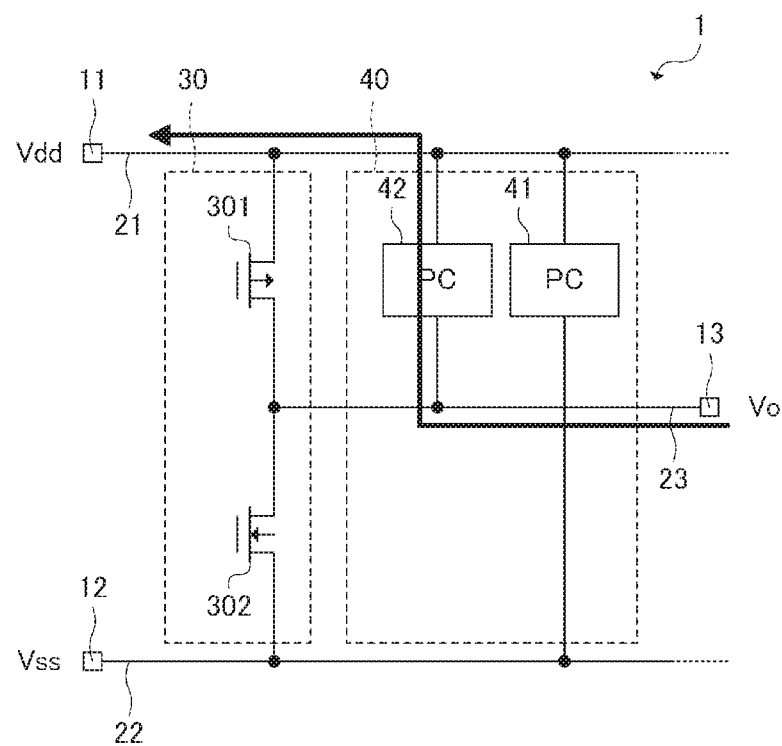
FIG. 5 is a diagram for illustrating a path through which a current caused by a positive surge voltage flows.

FIG. 5 is a diagram for illustrating a path through which a current caused by a positive surge voltage flows, the positive surge voltage having been generated in the terminal 13 when the potential of the voltage signal Vdd that is input to the terminal 11 is a ground potential. If a positive surge voltage whose potential is sufficiently larger than that of the voltage signal Vdd is generated in the terminal 13 when the potential of the voltage signal Vdd that is input to the terminal 11 is a ground potential, a current caused by the surge voltage flows via the forward path of the protection circuit 42 in a direction from the terminal 13 toward the terminal 11. Thus, the potential of the terminal 13 is determined based on the forward voltage of the protection circuit 42. Therefore, the internal circuit 30 can be protected by making the forward voltage of the protection circuit 42 smaller than the break voltage of the transistor 301.

Figure 6:
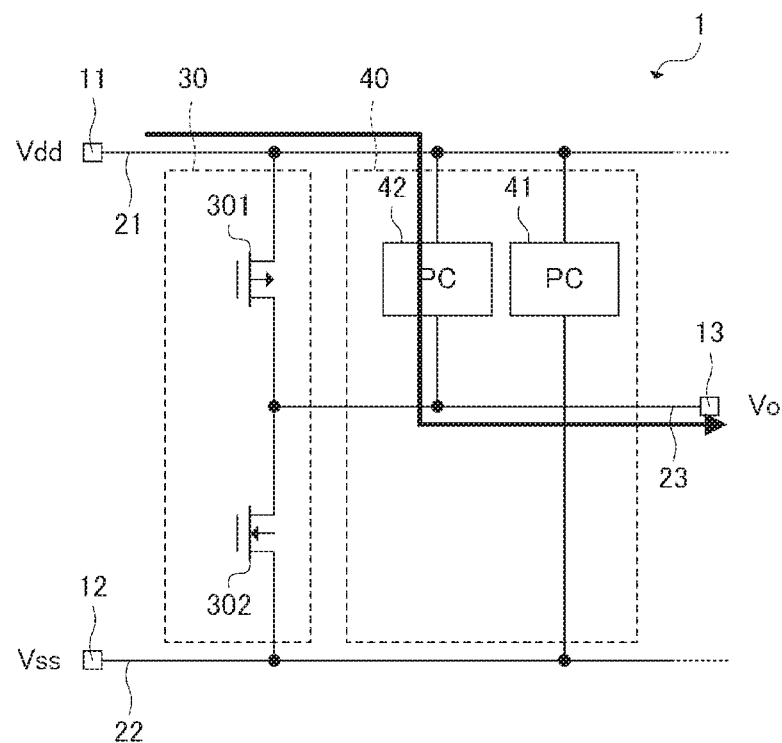
FIG. 6 is a diagram for illustrating a path through which a current caused by a negative surge voltage flows.

FIG. 6 is a diagram for illustrating a path through which a current caused by a negative surge voltage flows, the negative surge voltage having been generated in the terminal 13 when the potential of the voltage signal Vdd that is input to the terminal 11 is a ground potential. If a negative surge voltage whose potential is sufficiently smaller than that of the voltage signal Vss is generated in the terminal 13 when the potential of the voltage signal Vdd that is input to the terminal 11 is a ground potential, a current caused by the surge voltage flows via the reverse path of the protection circuit 42 in a direction from the terminal 11 toward the terminal 13. Thus, the potential of the terminal 13 is determined based on the reverse voltage of the protection circuit 42. Therefore, the internal circuit 30 can be protected by making the reverse voltage of the protection circuit 42 smaller than the break voltage of the transistor 301.

Figure 7:
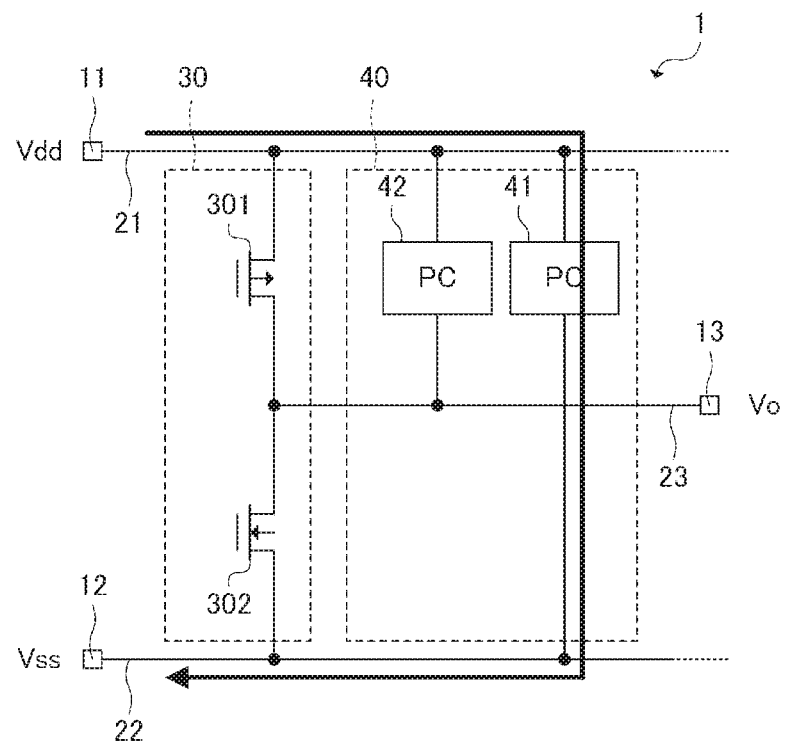
FIG. 7 is a diagram for illustrating a path through which a current caused by a positive surge voltage flows.

FIG. 7 is a diagram for illustrating a path through which a current caused by a positive surge voltage flows, the positive surge voltage having been generated in the terminal 11 when the potential of the voltage signal Vss that is input to the terminal 12 is a ground potential. If a positive surge voltage whose potential is sufficiently larger than that of the voltage signal Vdd is generated in the terminal 11 when the potential of the voltage signal Vss that is input to the terminal 12 is a ground potential, a current caused by the surge voltage flows via the reverse path of the protection circuit 41 in a direction from the terminal 11 toward the terminal 12. Thus, the potential of the terminal 11 is determined based on the reverse voltage of the protection circuit 41. Therefore, the internal circuit 30 can be protected by making the reverse voltage of the protection circuit 41 smaller than the break voltages of the transistors 301 and 302.

Figure 8:
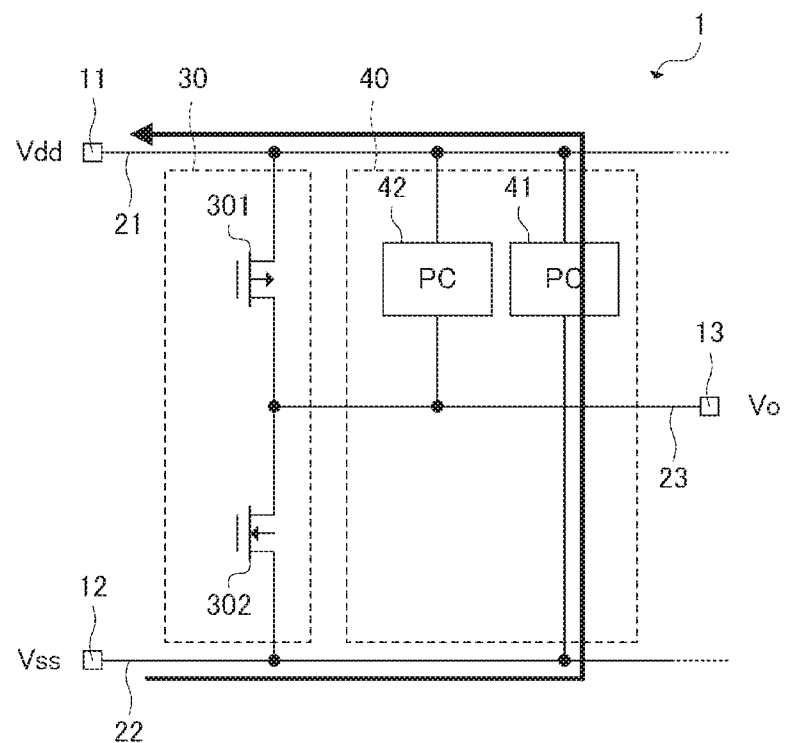
FIG. 8 is a diagram for illustrating a path through which a current caused by a negative surge voltage flows.

FIG. 8 is a diagram for illustrating a path through which a current caused by a negative surge voltage flows, the negative surge voltage having been generated in the terminal 11 when the potential of the voltage signal Vss that is input to the terminal 12 is a ground potential. If a negative surge voltage whose potential is sufficiently smaller than that of the voltage signal Vss is generated in the terminal 11 when the potential of the voltage signal Vss that is input to the terminal 12 is a ground potential, a current caused by the surge voltage flows via the forward path of the protection circuit 41 in a direction from the terminal 12 toward the terminal 11. Thus, the potential pf the terminal 12 is determined based on the forward voltage of the protection circuit 41. Therefore, the internal circuit 30 can be protected by making the forward voltage of the protection circuit 41 smaller than the break voltages of the transistors 301 and 302.

Figure 9:
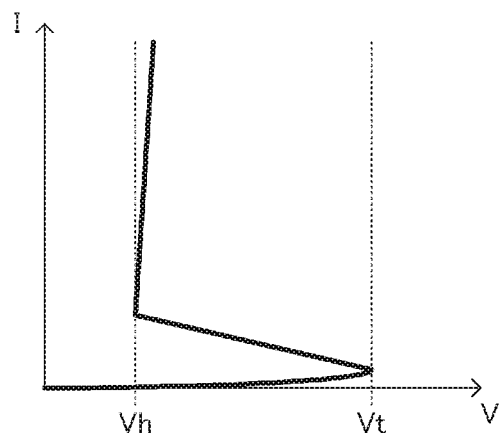
FIG. 9 is a diagram showing the relationship between a current that flows in a protection circuit and the difference in potential between a terminal VD and a terminal VS.

Here, operations of the protection circuit 42 shown in FIG. 2 will be described in detail with reference to FIGS. 2 and 9. FIG. 9 is a diagram showing the relationship between a current that flows in the protection circuit 42 and the difference in potential between the terminal VD and the terminal VS when the protection circuit 42 operates.

In the protection circuit 42, when the difference in potential between the terminal VD and the terminal VS exceeds a voltage Vt that is a breakdown voltage of the transistor 480, a signal that is based on the potentials of the source and gate is input to the drain of the transistor 480. Accordingly, a signal that is based on the potential of the propagation node 21 is input to the second gate terminal G2 of the thyristor 420 via the terminal VD. As a result, control is performed so as to switch on the thyristor 420. Accordingly, the transistor 480 functions as a trigger element for causing the thyristor 420 to operate, and the voltage Vt at which breakdown occurs in this transistor 480 is equivalent to a trigger voltage for controlling the thyristor 420 to be conductive. In addition, due to control being performed so as to switch on the thyristor 420, the difference in potential between the anode terminal A and the cathode terminal C of the thyristor 420 reaches the sum of a threshold voltage of the transistor 430 and a threshold voltage of the transistor 440. Therefore, the difference in potential between the terminal VD and the terminal VS is represented by a voltage Vh, which is the sum of the breakdown voltage of the transistor 490 and the difference in potential between the anode terminal A and the cathode terminal C of the thyristor 420. In other words, the protection circuit 42 limits the difference in potential between the terminal VD and the terminal VS to the voltage Vh. Note that, when calculating the above-mentioned voltage, of course, voltage drops in the resistors 450 and 460 need to be taken into consideration, but a description thereof is omitted in the present specification in order to avoid a complicated description.

As described above, in the protection circuit 42, the thyristor 420 operates as a result of the difference in potential between the terminal VD and the terminal VS exceeding the voltage Vt, and the difference in potential between the terminal VD and the terminal VS is then limited to the voltage Vh that is smaller than the voltage Vt. As described above, this voltage Vh is determined based on the forward voltages of the anode terminal A and the cathode terminal C when the thyristor 420 operates, and the difference in potential between the drain and source of the transistor 490 after breakdown has occurred in the transistor 490. Accordingly, in the protection circuit 42, the value of the voltage Vh can be appropriately set by controlling the difference in potential that occurs between the drain and source of the transistor 490 after breakdown has occurred in the transistor 490. Therefore, it is possible to realize a more versatile electrostatic protection circuit 40, and furthermore, it is possible to mitigate a risk that excessive voltage stress will be applied to the internal circuit 30 due to the voltage value to which a voltage is limited by the protection circuit 42.

Here, detailed configurations of the diode 410, the transistors 480 and 490, and the thyristor 420 that constitute the protection circuit 42 will be described FIGS. 10 to 12.

Figure 10:
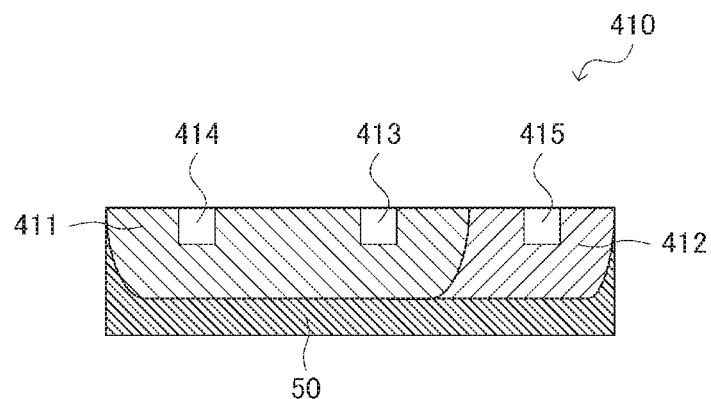
FIG. 10 is a cross-sectional diagram showing the configuration of a diode.

FIG. 10 is a cross-sectional diagram showing the configuration of the diode 410. As shown in FIG. 10, the diode 410 includes a p-type semiconductor substrate 50, an n-well region 411 obtained by adding impurities to the p-type semiconductor substrate 50, and a p-well region 412 obtained by adding impurities to the p-type semiconductor substrate 50.

An n-region 413 that functions as the cathode of the diode 410, and a p-region 414 that functions as the anode of the diode 410 are formed in the n-well region 411. Also, a p-region 415 to which the voltage signal Vss for determining the potential of the semiconductor substrate 50 is applied is formed in the p-well region 412.

In the diode 410 configured as described above, the n-region 413 and the p-region 414 are separated from the p-region 415 by a parasite diode formed by the n-well region 411 and the p-well region 412. Therefore, even when the potential of the p-region 414 that is the anode of the diode 410 reaches a potential smaller than that of the voltage signal Vss, a risk that the potential of the voltage signal Vss will decrease is mitigated.

Figure 11:
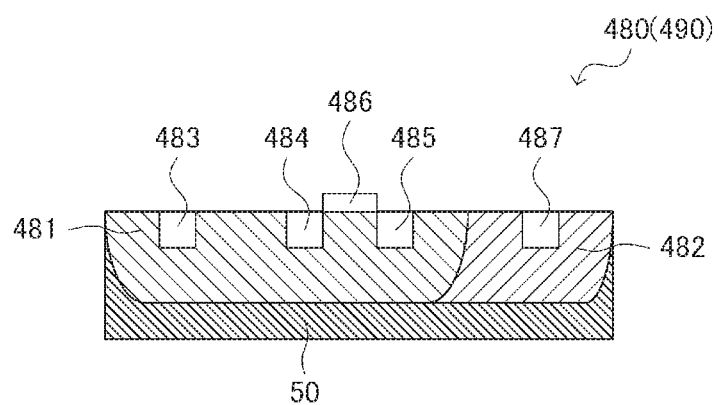
FIG. 11 is a cross-sectional diagram showing the configuration of a transistor.

FIG. 11 is cross-sectional diagram showing the configuration of the transistor 480. Note that the transistor 480 and the transistor 490 have similar configurations. Therefore, in the following description, only the configuration of the transistor 480 will be described, and a detailed description of the configuration of the transistor 490 is omitted. As shown in FIG. 11, the transistor 480 includes the p-type semiconductor substrate 50, an n-well region 481 obtained by adding impurities to the p-type semiconductor substrate 50, and a p-well region 482 obtained by adding impurities to the p-type semiconductor substrate 50.

An n-region 483 that functions as a back gate of the transistor 480, a p-region 484 that functions as the source of the transistor 480, and a p-region 485 that functions as the drain of the transistor 480 are formed in the n-well region 481. In addition, an n-region 486 that functions as the gate of the transistor 480 is layered so as to at least partially overlap the p-region 484 and the p-region 485 via an insulator (not illustrated). In addition, a p-region 487 to which the voltage signal Vss for determining the potential of the semiconductor substrate 50 is input is formed in the p-well region 482.

In the transistor 480 configured as described above, the n-region 483, the p-region 484, and the n-region 486 are separated from the p-region 487 by a parasite diode that is formed by the n-well region 481 and the p-well region 482. Therefore, even when the potential of one of the n-region 483 that functions as a back gate, the p-region 484 that functions as the source of the transistor 480, and the n-region 486 that functions as the gate of the transistor 480 is lower than the potential of the voltage signal Vss, the risk that the potential of the voltage signal Vss will decrease is mitigated.

Figure 12:
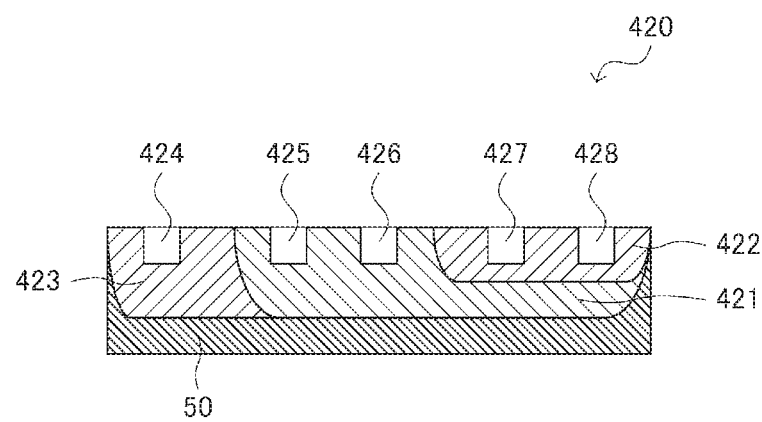
FIG. 12 is a cross-sectional diagram showing the configuration of a thyristor.

FIG. 12 is a cross-sectional diagram showing the configuration of the thyristor 420. As shown in FIG. 12, the thyristor 420 includes the p-type semiconductor substrate 50, an n-well region 421 obtained by adding impurities to the p-type semiconductor substrate 50, a p-well region 422 formed in the n-well region 421, and a p-well region 423 obtained by adding impurities to the p-type semiconductor substrate 50.

An n-region 425 that functions as a first gate of the thyristor 420, and a p-region 426 that functions as the anode of the thyristor 420 are formed in the n-well region 421. Also, an n-region 427 that functions as the cathode of the thyristor 420, and a p-region 428 that functions as a second gate of the thyristor 420 are formed in the p-well region 422. Accordingly, the thyristor 420 is formed by the n-region 425 and the p-region 426 formed in the n-well region 421, and the n-region 427 and the p-region 428 formed in the p-well region 422. Also, a p-region 424 to which the voltage signal Vss for determining the potential of the semiconductor substrate 50 is applied is formed in the p-well region 423. Here, the n-well region 421 is an example of a first impurity-doped region, and the p-well region 422 is an example of a second impurity-doped region.

In the thyristor 420 configured as described above, the p-well region 422 and the p-well region 423 are separated by the n-well region 421. Therefore, even when the potential of the n-region 427 that functions as the cathode of the thyristor reaches a potential smaller than that of the voltage signal Vss, the risk that the potential of the voltage signal Vss will decrease is mitigated.

In the protection circuit 42 that includes the diode 410, the transistors 480 and 490, and the thyristor 420 configured as described above, a parasite diode in which the terminal VD functions as a cathode and the terminal VS functions as an anode is not formed. Therefore, the risk that the potential of the terminal 12 to which the voltage signal Vss is supplied will decrease, when a negative surge voltage is supplied to the terminal VD, is further mitigated. Here, the semiconductor substrate 50 shown in FIGS. 10 to 12 is an example of a substrate.

In addition, it suffices for the transistor 480 of the protection circuit 42 to be configured such that breakdown occurs at any value, and the transistor 480 may also be, for example, a diode element, a PNP bipolar transistor element, a GGnMOS transistor element, or an NPN bipolar transistor element. Similarly, it suffices for the transistor 490 to be configured such that the potential of the protection circuit 42 when the protection circuit 42 operates can be limited as a result of breakdown occurring, and the transistor 490 may also be, for example, a diode element, a PNP bipolar transistor element, a GGnMOS transistor element, or an NPN bipolar transistor element.

Actions and Effects

In the electrostatic protection circuit 40 included in the integrated circuit apparatus 1 configured as described above includes the protection circuit 41 electrically connected to the terminal 11 and the terminal 12, and the protection circuit 42 electrically connected to the terminal 11 and the terminal 13. In addition, the protection circuit 42 includes the diode 410 whose anode is electrically connected to the terminal 13, and whose cathode is electrically connected to the terminal 11, the thyristor 420 whose cathode is electrically connected to the terminal 13, the transistor 490 electrically connected to the anode of the thyristor 420, and the transistor 480 that is electrically connected to the gate of the thyristor 420, and causes the thyristor 420 to operate.

In the electrostatic protection circuit 40 configured as described above, the difference in potential between the terminal VD and the terminal VS on the forward path when the protection circuit 42 operates is determined based on the difference in potential between the anode terminal A and the cathode terminal C when the thyristor 420 operates, and the difference in potential between the drain and the source of the transistor 490 when breakdown occurs in the transistor 490. On the other hand, the difference in potential between the terminal VS and the terminal VD on the reverse path in the protection circuit 42 is determined based on the forward voltage of the diode 410. Therefore, the difference in potential between the terminal VD and the terminal VS that is limited by the protection circuit 42 can be made smaller than that in case where the protection circuit 42 is constituted only by a diode element. Therefore, it is possible to increase the difference between the voltage value of a break voltage at which there is a risk that breakdown will occur in the integrated circuit apparatus 1 and the voltage value to which a surge voltage is limited by the electrostatic protection circuit 40.

Furthermore, the difference in potential between the terminal VD and the terminal VS on the forward path when the protection circuit 42 according to this embodiment operates can be changed by adjusting the difference in potential between the drain and source of the transistor 490 when breakdown occurs in the transistor 490. The voltage value at which the protection circuit 42 operates can be changed by adjusting the voltage value at which breakdown occurs in the transistor 480. Therefore, it is possible to improve the versatility of the electrostatic protection circuit 40 provided with the protection circuit 42.

2. Second Embodiment

Figure 13:
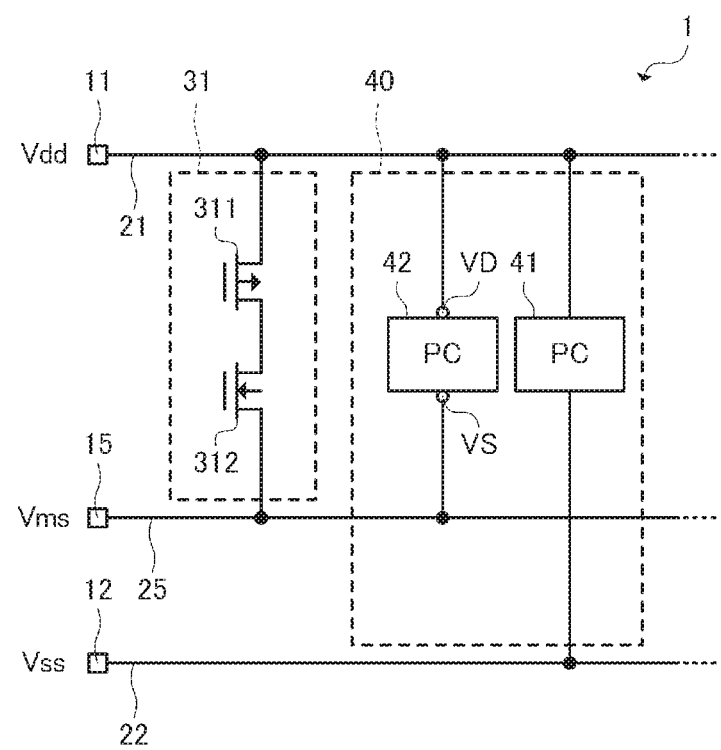
FIG. 13 is a diagram showing the configuration of an integrated circuit device provided with an electrostatic protection circuit according to a second embodiment.

FIG. 13 is a diagram illustrating the configuration of an integrated circuit apparatus 1 provided with an electrostatic protection circuit 40 according to a second embodiment. As shown in FIG. 13, the integrated circuit apparatus 1 includes terminals 11, 12, and 15, an internal circuit 31, and the electrostatic protection circuit 40. The electrostatic protection circuit 40 according to the second embodiment is different from that of the integrated circuit apparatus 1 described in the first embodiment in that the electrostatic protection circuit 40 of the integrated circuit apparatus 1 protects the internal circuit 31 against a surge voltage generated in the terminal 15 to which a reference potential in the integrated circuit apparatus 1 is input. Note that, in a description of the integrated circuit apparatus 1 according to the second embodiment, the same reference numerals are assigned to constituent elements similar to those in the first embodiment, and a description thereof may be omitted or simplified.

In the integrated circuit apparatus 1 according to the second embodiment, the voltage signal Vdd that is input to the terminal 11, the voltage signal Vss that is input to the terminal 12, and whose potential is lower than that of the voltage signal Vdd, and a voltage signal Vms that is input to the terminal 15, and whose potential is lower than that of the voltage signal Vdd and is higher than that of the voltage signal Vss are used as drive voltages, and the internal circuit 31 operates based on the difference in potential between the terminal 11 and the terminal 15. The electrostatic protection circuit 40 is electrically connected to the terminals 11, 12, and 15. Accordingly, the electrostatic protection circuit 40 mitigates the influence of a surge voltage on the internal circuit 31.

Here, a surge voltage may be a voltage that has been generated due to electrostatic, for example, and differs very largely in potential from the voltage signal Vdd and the voltage signal Vss, a voltage that has been caused by noise or the like generated as the integrated circuit apparatus 1 operates, and differs very largely in potential from the voltage signal Vdd and the voltage signal Vss, or the like. Note that, in the following description, a surge voltage that is sufficiently larger than the potential of the voltage signal Vdd is referred to as a "positive surge voltage", and a surge voltage that is sufficiently smaller than the potential of the voltage signal Vss is referred to as a "negative surge voltage".

Here, the voltage signal Vdd is an example of a first voltage signal according to the second embodiment, and the terminal 11 to which the voltage signal Vdd is input is an example of a first terminal according to the second embodiment. In addition, the voltage signal Vss is an example of a second voltage signal, and the terminal 12 to which the voltage signal Vss is input is an example of a second terminal. Moreover, the voltage signal Vms is an example of a third voltage signal, and the terminal 15 to which the voltage signal Vms is input is an example of a third terminal.

The internal circuit 31 includes transistors 311 and 312. A description will be given assuming that the transistor 311 according to this embodiment is a P-channel MOS transistor, and the transistor 312 is an N-channel MOS transistor. The source of the transistor 311 is electrically connected to the terminal 11 via the propagation node 21. Also, the drain of the transistor 311 is electrically connected to the drain of the transistor 312. The source of the transistor 312 is electrically connected to the terminal 15 via a propagation node 25. Accordingly, the internal circuit 31 electrically connects the terminal 11 and the terminal 15. Here, a signal that is propagated via the propagation node 25 is, for example, a signal that indicates the reference potential of the internal circuit 31, in the integrated circuit apparatus 1.

In addition, an H-level or L-level signal that is based on the operation of the integrated circuit apparatus 1 is input to the gates of the transistors 311 and 312. If an H-level signal is input to the gates of the transistors 311 and 312, control is performed so as to switch off the transistor 311, and switch on the transistor 312. On the other hand, if an L-level signal is input to the gates of the transistors 311 and 312, control is performed so as to switch on the transistor 311, and switch off the transistor 312. Accordingly, the internal circuit 31 outputs various signals that are used in the integrated circuit apparatus 1, based on a signal that is input to the gates of the transistors 311 and 312. Therefore, in the integrated circuit apparatus 1 according to the second embodiment, the internal circuit 31 functions as a circuit for generating or relaying various signals for causing the integrated circuit apparatus 1 to operate.

The electrostatic protection circuit 40 includes the protection circuit 41 and 42.

One end of the protection circuit 41 is electrically connected to the propagation node 21 electrically connected to the terminal 11, and the other end is electrically connected to the propagation node 22 electrically connected to the terminal 12. In other words, the protection circuit 41 is electrically connected to the terminal 11 and the terminal 12. When a surge voltage such as an electrostatic voltage is input to the integrated circuit device 1, the protection circuit 41 limits the difference in potential between the terminal 11 and the terminal 12 to a predetermined value.

Note that the difference in potential between the terminal 11 and the terminal 12 that is limited by the protection circuit 41 is set is larger than or equal to the maximum operation voltage of the integrated circuit apparatus 1, and smaller than or equal to the break voltage of the internal circuit 31. Specifically, the value of the difference in potential between the terminal 11 and the terminal 12 limited by the protection circuit 41 is set to a value that is larger than or equal to the maximum operation voltage of the integrated circuit device 1, and that is smaller than the sum of the smaller of the value of the breakdown voltage of the transistor 311 of the internal circuit 31 and the value of the breakdown voltage of a parasite diode included in the transistor 311 and the smaller of the value of the breakdown voltage of the transistor 312 of the internal circuit 31 and the value of the breakdown voltage of a parasite diode included in the transistor 312. Here, the protection circuit 41 may have any configuration that makes it possible to limit the difference in potential between the terminal 11 and the terminal 12 to the above-described range of the difference in potential, and may include, for example, a diode whose anode is electrically connected to the terminal 12, and whose cathode is electrically connected to the terminal 11. This protection circuit 41 is an example of a first protection circuit according to the second embodiment.

The protection circuit 42 has a configuration similar to that of the protection circuit 42 according to the first embodiment shown in FIG. 2, and includes the diode 410 whose anode is electrically connected to the terminal 15, and whose cathode is electrically connected to the terminal 11, the thyristor 420 with the cathode terminal C is electrically connected to the terminal 15, the transistor 490 electrically connected to the anode terminal A of the thyristor 420, and the transistor 480 that is electrically connected to the second gate terminal G2 of the thyristor 420, and causes the thyristor 420 to operate.

One end of the protection circuit 42 is electrically connected to the propagation node 21 electrically connected to the terminal 11, and the other end is electrically connected to the propagation node 25 electrically connected to the terminal 15. In other words, the protection circuit 42 is electrically connected to the terminal 11 and the terminal 15. The protection circuit 42 operates when the difference in potential between the propagation node 21 and the propagation node 25 exceeds a predetermined value. As a result of the protection circuit 42 operating, the difference in potential between the propagation node 21 and the propagation node 25 is limited to the predetermined value. Here, the difference in potential at which the protection circuit 42 operates is set to a value that is smaller than the sum of the value of the smaller of the breakdown voltage of the transistor 311 of the internal circuit 31 and the breakdown voltage of the parasite diode included in the transistor 311 and the value of the smaller of the breakdown voltage of the transistor 312 of the internal circuit 31 and the breakdown voltage of the parasite diode included in the transistor 312. This protection circuit 42 is an example of a second protection circuit according to the second embodiment.

The electrostatic protection circuit 40 of the integrated circuit apparatus 1 according to the second embodiment configured as described above can mitigate a risk that a surge voltage that has been caused by noise or the like generated as the integrated circuit apparatus 1 operates, and differs very largely in potential from the voltage signal Vdd and the voltage signal Vss, as well as a surge voltage that has been generated due to electrostatic or the like, and differs largely in potential from the voltage signal Vdd and the voltage signal Vss, will affect the internal circuit 31.

3. Third Embodiment

Figure 14:
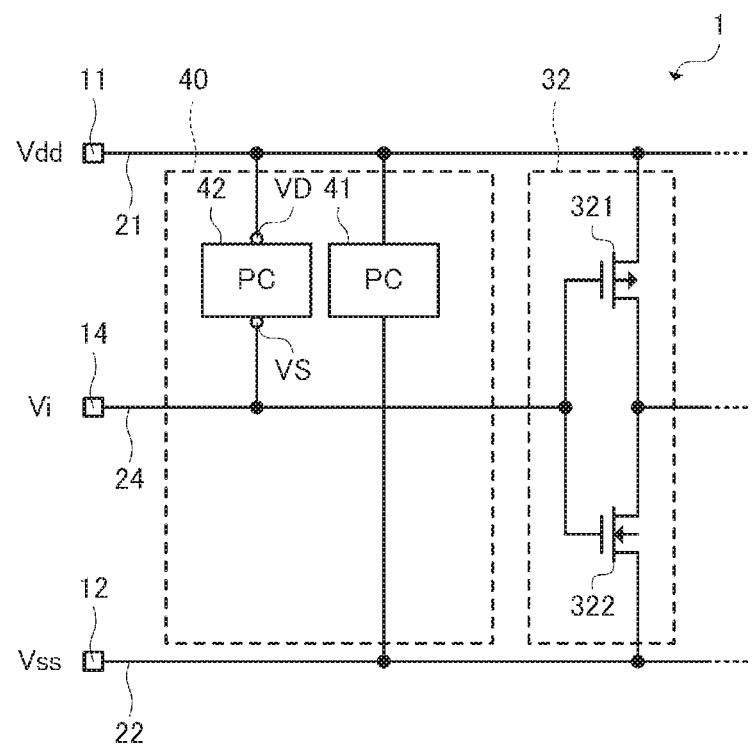
FIG. 14 is a diagram showing the configuration of an integrated circuit device provided with an electrostatic protection circuit according to a third embodiment.

Next, an integrated circuit device 1 provided with an electrostatic protection circuit 40 according to a third embodiment will be described. FIG. 14 is a diagram showing the configuration of the integrated circuit device 1 provided with the electrostatic protection circuit 40 according to the third embodiment. The electrostatic protection circuit 40 according to the third embodiment is different from that of the integrated circuit apparatus 1 according to the first embodiment in that the influence of a surge voltage on an internal circuit 32 that operates based on a signal that is input from a terminal 14 for inputting various signals to the integrated circuit apparatus 1 is mitigated.

FIG. 14 is a diagram showing the configuration of the integrated circuit apparatus 1 provided with the electrostatic protection circuit 40 according to the third embodiment. As shown in FIG. 14, the integrated circuit device 1 includes the terminals 11, 12, and 14, the internal circuit 32, and the electrostatic protection circuit 40. In the integrated circuit device 1 according to the third embodiment, various constituent elements of the integrated circuit device 1 that include the internal circuit 32 operate based on the difference in potential between the voltage signal Vdd that is input to the terminal 11 and the voltage signal Vss whose potential is lower than that of the voltage signal Vdd, and that is input to the terminal 12. Such various constituent elements included in the integrated circuit device 1 operate based on a voltage signal Vi that is input from the terminal 14. The electrostatic protection circuit 40 is electrically connected to the terminal 11 to which the voltage signal Vdd is input, the terminal 12 to which the voltage signal Vss whose potential is lower than that of the voltage signal Vdd is input, and the terminal 14 that is connected to an external circuit of the integrated circuit device 1, and mitigates the influence of a surge voltage on the internal circuit 32.

The internal circuit 32 includes transistors 321 and 322. A description will be given assuming that the transistor 321 according to this embodiment is a P-channel MOS transistor, and the transistor 322 is an N-channel MOS transistor. The source of the transistor 321 is electrically connected to the terminal 11 via the propagation node 21. Also, the drain of the transistor 321 is electrically connected to the drain of the transistor 322. The source of the transistor 322 is electrically connected to the terminal 12 via the propagation node 22. In addition, a signal generated at a connection point at which the drain of the transistor 321 and the drain of the transistor 322 are connected is input to various constituent elements of the integrated circuit device 1.

In addition, the gates of the transistors 321 and 322 are electrically connected to the terminal 14 via a propagation node 24. When the voltage signal Vi at an H level is input to the terminal 14, control is performed so as to switch off the transistor 321, and switch on the transistor 322. Therefore, an L-level signal is input to various constituent elements in the integrated circuit device 1. On the other hand, when the voltage signal Vi at the L level is input to the terminal 14, control is performed so as to switch on the transistor 321, and switch off the transistor 322. Therefore, an H-level signal is input to various constituent elements in the integrated circuit device 1.

As described above, in the integrated circuit device 1 according to the third embodiment, the internal circuit 32 functions as an input circuit that supplies a signal that is based on the voltage signal Vi that is input to various constituent elements of the integrated circuit device 1, and the terminal 14 functions as an input terminal to which the voltage signal Vi is input.

The electrostatic protection circuit 40 includes the protection circuits 41 and 42.

One end of the protection circuit 41 is electrically connected to the propagation node 21 electrically connected to the terminal 11, and the other end is electrically connected to the propagation node 22 electrically connected to the terminal 12. In other words, the protection circuit 41 is electrically connected to the terminal 11 and the terminal 12. Also, one end the protection circuit 42 is electrically connected to the terminal 11, and the other end is electrically connected to the propagation node 24 electrically connected to the terminal 14. In other words, the protection circuit 42 is electrically connected to the terminal 11 and the terminal 14.

As described above, with the integrated circuit device 1 and the electrostatic protection circuit 40, even if a surge voltage such as an electrostatic voltage occurs in the terminal 14 that functions as an input terminal to which a signal is input from the outside, it is possible to mitigate the influence of the surge voltage on the internal circuit 32 in a manner similar to the electrostatic protection circuits 40 according to the first embodiment.

4. Forth Embodiment

Figure 15:
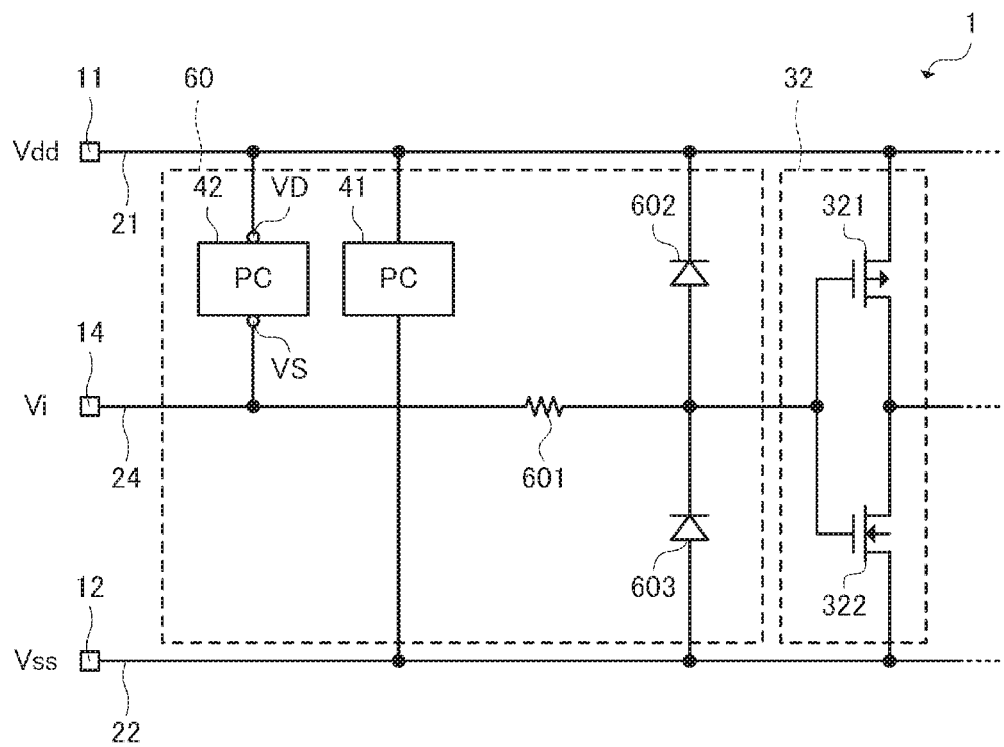
FIG. 15 is a diagram showing the configuration of an integrated circuit device provided with an electrostatic protection circuit according to a fourth embodiment.

Next, an integrated circuit device 1 provided with an electrostatic protection circuit 40 according to a forth embodiment will be described. FIG. 15 is a diagram showing the configuration of the integrated circuit device 1 provided with the electrostatic protection circuit 40 according to the forth embodiment. The electrostatic protection circuit 40 according to the forth embodiment has a configuration for protecting the gates of the transistors 321 and 322 of the internal circuit 32, in addition to the configuration of the electrostatic protection circuit 40 according to the third embodiment that operates based on a signal input from the terminal 14 that inputs various signals to the integrated circuit device 1, thereby mitigating a risk that the thicknesses of the gate films of the transistors 321 and 322 will increase. Accordingly, it is possible to mitigate a risk that the sizes of the transistors 321 and 322 will increase and a risk that the operation speed will decrease.

As shown in FIG. 15, the integrated circuit device 1 includes the terminal 11, 12, and 14, the internal circuit 32, and the electrostatic protection circuit 40.

The internal circuit 32 includes the transistors 321 and 322. The source of the transistor 321 is electrically connected to the terminal 11 via the propagation node 21. Also, the drain of the transistor 321 is electrically connected to the drain of the transistor 322. The source of the transistor 322 is electrically connected to the terminal 12 via the propagation node 22. In addition, a signal generated at a connection point at which the drain of the transistor 321 and the drain of the transistor 322 are connected is input to various constituent elements of the integrated circuit device 1.

In addition, the gates of the transistors 321 and 322 are electrically connected to the terminal 14 via a resistor 601 and the propagation node 24. When the voltage signal Vi at the H level is input to the terminal 14, control is performed so as to switch off the transistor 321 and switch on the transistor 322. Therefore, an L-level signal is input to various constituent elements in the integrated circuit device 1. On the other hand, when the voltage signal Vi at the L level is input to the terminal 14, control is performed so as to switch on the transistor 321, and switch off the transistor 322. Therefore, an H-level signal is input to various constituent elements in the integrated circuit device 1.

The electrostatic protection circuit 40 includes the protection circuits 41 and 42, the resistor 601, and diodes 602 and 603.

One end of the protection circuit 41 is electrically connected to the propagation node 21 electrically connected to the terminal 11, and the other end is electrically connected to the propagation node 22 electrically connected to the terminal 12. In addition, one end of the protection circuit 42 is electrically connected to the propagation node 21 electrically connected to the terminal 11, and the other end is electrically connected to the propagation node 24 electrically connected to the terminal 14.

One end of the resistor 601 is electrically connected to the terminal 14, and the other end is electrically connected to the gates of the transistors 321 and 322 of the internal circuit 32. The anode of the diode 602 is electrically connected to the other end of the resistor 601 and the gates of the transistors 321 and 322 of the internal circuit 32, and the cathode of the diode 602 is electrically connected to the terminal 11 via the propagation node 21. The anode of the diode 603 is electrically connected to the terminal 12 via the propagation node 22, and the cathode is electrically connected to the other end of the resistor 601 and the gates of the transistors 321 and 322 of the internal circuit 32.

Accordingly, the electrostatic protection circuit 40 according to the fourth embodiment includes the resistor 601 whose one end is electrically connected to the terminal 14, and whose other end is electrically connected to the internal circuit 32, the diode 602 whose anode is electrically connected to the other end of the resistor 601, and whose cathode is electrically connected to the terminal 11, and the diode 603 whose anode is electrically connected to the terminal 12, and whose cathode is electrically connected to the other end of the resistor 601. Here, the resistor 601 is an example of a resistive element according to the forth embodiment, the diode 602 is an example of a second diode element according to the forth embodiment, and the diode 603 is an example of a third diode element according the forth embodiment.

In the electrostatic protection circuit 40 according to the fourth embodiment configured as described above, if the potential of the voltage signal Vi that is input to the terminal 14 is larger than that of the voltage signal Vdd, a voltage that is input to the gates of the transistors 321 and 322 is clamped by the diode 602. On the other hand, if the potential of the voltage signal Vi that is input to the terminal 14 is smaller than that of the voltage signal Vss, a voltage that is input to the gates of the transistors 321 and 322 is clamped by the diode 603. Therefore, in the electrostatic protection circuit 40 according to the fourth embodiment, in addition to actions and effects of the electrostatic protection circuit 40 according to the third embodiment, it is possible to mitigate a risk that the thicknesses of the gate films of the transistors 321 and 322 will increase, and it is also possible to mitigate a risk that the sizes of the transistors 321 and 322 will increase, and a risk that the operation speed of the internal circuit 32 will decrease.

5. Fifth Embodiment

Figure 16:
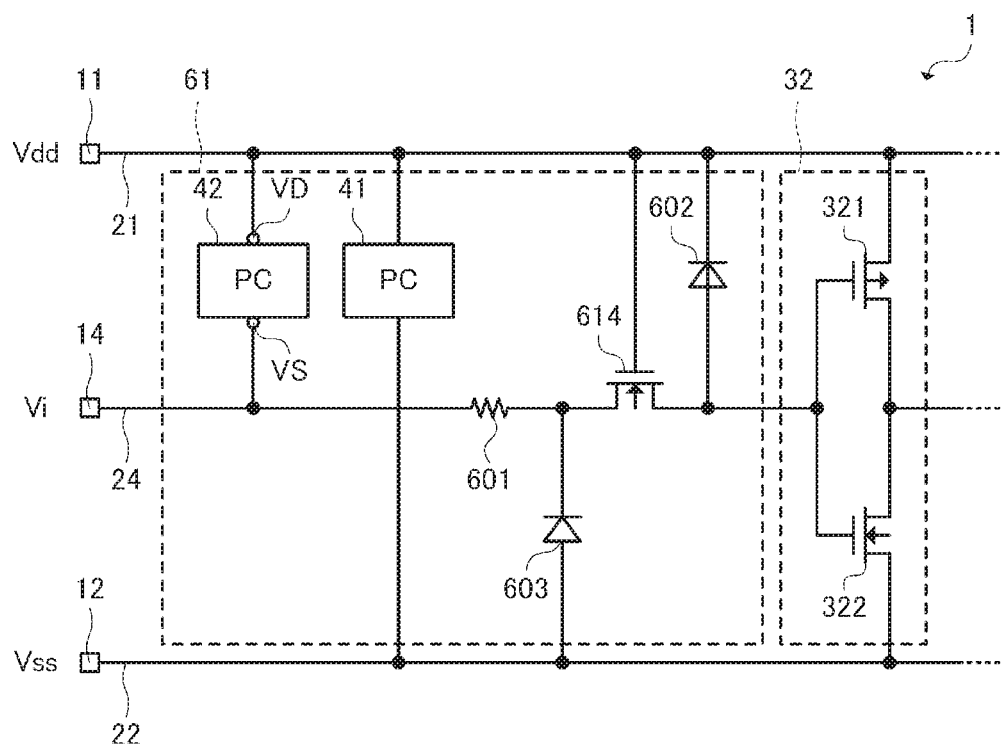
FIG. 16 is a diagram showing the configuration of an integrated circuit device provided with an electrostatic protection circuit according to a fifth embodiment.

Next, an integrated circuit device 1 provided with an electrostatic protection circuit 40 according to a fifth embodiment will be described. FIG. 16 is a diagram showing the configuration of the integrated circuit device 1 provided with the electrostatic protection circuit 40 according to the fifth embodiment. The electrostatic protection circuit 40 according to the fifth embodiment is different from the electrostatic protection circuit 40 according to the forth embodiment, in that a transistor 614 for protecting the gates of the transistors 321 and 322 of the internal circuit 32 is provided.

With the electrostatic protection circuit 40 according to the forth embodiment, when the voltage signal Vi whose potential is larger than that of the voltage signal Vdd is supplied to the terminal 14, it is possible to mitigate a risk that the sizes of the transistors 321 and 322 will increase, by protecting the gates of the transistors 321 and 322 of the internal circuit 32, and also mitigate a risk that the operation speed of the internal circuit 32 will decrease, but there is a risk that a leak current that flows from the propagation node 24 toward the propagation node 21 via the diode 602 will be generated.

In the electrostatic protection circuit 40 according to the fifth embodiment, it is possible to reduce a risk that a leak current will be generated and flow from the propagation node 24 toward the propagation node 21 via the diode 602, by providing the transistor 614 between the other end of the resistor 601 and the anode of the diode 602, as shown in FIG. 16.

Specifically, the drain of the transistor 614 is electrically connected to the other end of the resistor 601. The source of the transistor 614 is electrically connected to the anode of the diode 602. Also, the gate of the transistor 614 is electrically connected to the propagation node 21. In other words, the electrostatic protection circuit 40 according to the fifth embodiment includes the resistor 601 whose one end is electrically connected to the terminal 14, the transistor 614 whose drain is electrically connected to the other end of the resistor 601, whose source is electrically connected to the internal circuit 32, and whose gate is electrically connected to the terminal 11, the diode 602 whose anode is electrically connected to the source of the transistor 614, and whose cathode is electrically connected to the terminal 11, and the diode 603 whose anode is electrically connected to the terminal 12, and whose cathode is electrically connected to the other end of the resistor 601. Here, the resistor 601 is an example of a resistive element according to the fifth embodiment, the transistor 614 is an example of an NMOS transistor, the diode 602 is an example of a second diode element according to the fifth embodiment, and the diode 603 is an example of a third diode element according to the fifth embodiment. Note that a structure in which the source of the transistor 614 is electrically connected to the internal circuit 32 or a structure in which the source and the semiconductor substrate 50 are electrically connected to the internal circuit 32 may also be adopted.

In the electrostatic protection circuit 40 according to the fifth embodiment configured as described above, when the potential of the anode of the diode 602, namely the potential of the gate of the transistor 321 or 322 of the internal circuit 32 exceeds the potential of the voltage signal Vdd that propagates in the propagation node 21, control is performed so as to switch off the transistor 614. Therefore, it is possible to mitigate a risk that a leak current will be generated and flow from the propagation node 24 toward the propagation node 21 via the diode 602. Accordingly, with the electrostatic protection circuit 40 according to the fifth embodiment, in addition to actions and effects of the electrostatic protection circuit 40 according to the fifth embodiment, it is possible to mitigate a risk that a leak current will be generated in the diode 602.

6. Sixth Embodiment

Figure 17:
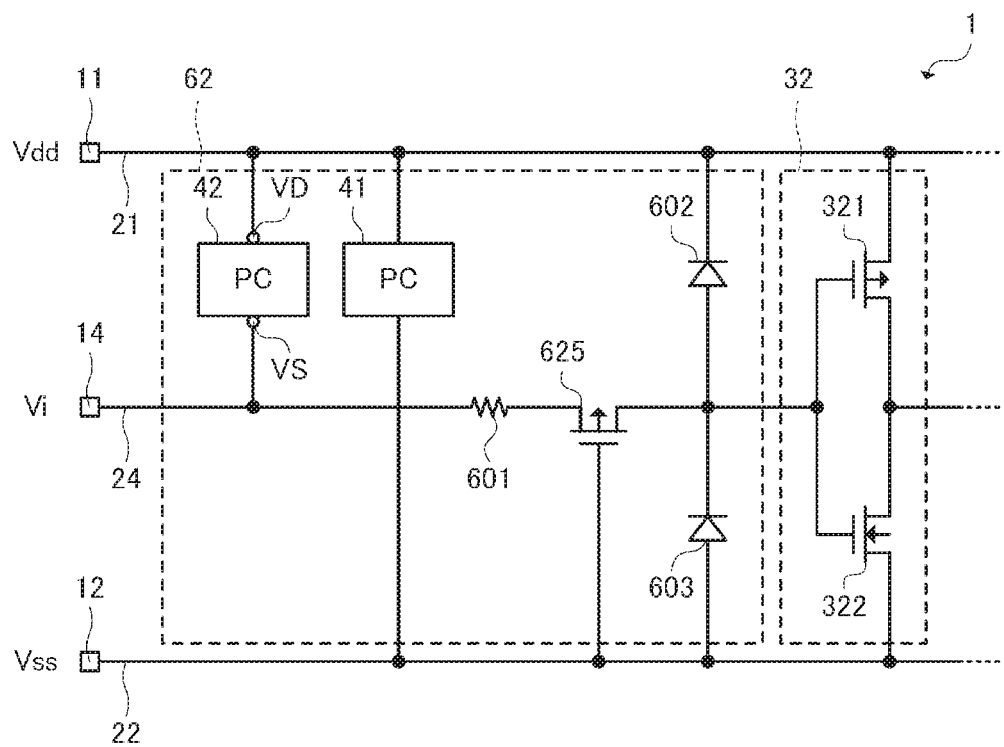
FIG. 17 is a diagram showing the configuration of an integrated circuit device provided with an electrostatic protection circuit according to a sixth embodiment.

Next, an integrated circuit device 1 provided with an electrostatic protection circuit 40 according to a sixth embodiment will be described. FIG. 17 is a diagram showing the configuration of the integrated circuit device 1 provided with the electrostatic protection circuit 40 according to the sixth embodiment. The electrostatic protection circuit 40 according to the sixth embodiment is different from the electrostatic protection circuit 40 according to the forth embodiment, in that a transistor 625 for protecting the transistors 321 and 322 of the internal circuit 32 is provided.

With the electrostatic protection circuit 40 according to the forth embodiment, when the voltage signal Vi whose potential is smaller than that of the voltage signal Vss is supplied to the terminal 14, there is a risk that a leak current that flows from the propagation node 22 to the propagation node 24 via the diode 603 will be generated.

In the electrostatic protection circuit 40 according to the sixth embodiment, it is possible to mitigate a risk that a leak current will be generated and flow from the propagation node 22 toward the propagation node 24 via the diode 603, by providing the transistor 625 between the other end of the resistor 601 and the anode of the diode 602 and the cathode of the diode 603, as shown in FIG. 17.

Specifically, the drain of the transistor 625 is electrically connected to the other end of the resistor 601. The source of the transistor 625 is electrically connected to the anode of the diode 602 and the cathode of the diode 603. Also, the gate of the transistor 625 is electrically connected to the propagation node 22. In other words, the electrostatic protection circuit 40 includes the resistor 601 whose one end is electrically connected to the terminal 14, the transistor 625 whose drain is electrically connected to the other end of the resistor 601, whose source is electrically connected to the internal circuit 32, and whose gate is electrically connected to the terminal 12, the diode 602 whose anode is electrically connected to the source of the transistor 625, and whose cathode is electrically connected to the terminal 11, and the diode 603 whose anode is electrically connected to the terminal 12, and whose cathode is electrically connected to the source of the transistor 625. Here, the resistor 601 is an example of a resistive element according to the sixth embodiment, the transistor 625 is an example of a PMOS transistor, the diode 602 is an example of a second diode element according to the sixth embodiment, and the diode 603 is an example of a third diode element according to the sixth embodiment. Note that a structure in which the source of the transistor 625 is electrically connected to the internal circuit 32, or a structure in which the source and the semiconductor substrate 50 are electrically connected to the internal circuit 32 may also be adopted.

In the electrostatic protection circuit 40 according to the sixth embodiment configured as described above, when the potential of the cathode of the diode 603, namely the potential of the gate of the transistor 311 or 312 of the internal circuit 31, is smaller than the potential of the voltage signal Vss that propagates in the propagation node 22, control is performed so as to switch off the transistor 625. Therefore, it is possible to mitigate a risk that a leak current will be generated and flow from the propagation node 22 toward the propagation node 24 via the diode 603. Accordingly, with the electrostatic protection circuit 40 according to the sixth embodiment, in addition to the actions and effects of the electrostatic protection circuit 40 according to the forth embodiment, it is possible to mitigate a risk that a leak current will be generated in the diode 603.

As described above, the embodiments and the modifications have been described, but the present disclosure is not limited to these embodiments, and can be implemented in various modes without departing from the scope of the disclosure. For example, the above-embodiments can be appropriately combined.

The present disclosure includes substantially the same configurations (configurations with the same functions, methods, and results, or configurations with the same objects and effects, for example) as the configurations described in the embodiments. The present disclosure includes configurations in which an unessential part of the configurations described in the embodiments is replaced. The present disclosure also includes configurations that achieve the same effects as those of the configurations described in the embodiments, or configurations that can achieve the same objects as those of the configurations described in the embodiments. The present disclosure also includes configurations obtained by adding a known technique to the configurations described in the embodiments.

What is claimed is:

1. An electrostatic protection circuit that is electrically connected to a first terminal to which a first voltage signal is input, a second terminal to which a second voltage signal whose potential is lower than that of the first voltage signal is input, and a connection terminal that is connected to an external circuit, and mitigates the influence of a surge voltage on an internal circuit, the electrostatic protection circuit comprising:
   a first protection circuit that is electrically connected to the first terminal and the second terminal; and
   a second protection circuit that is electrically connected to the first terminal and the connection terminal,
   wherein the second protection circuit includes:
   a first diode element whose anode is electrically connected to the connection terminal, and whose cathode is electrically connected to the first terminal,
   a thyristor element whose cathode is electrically connected to the connection terminal,
   a voltage limiting element that is electrically connected to an anode of the thyristor element, and
   a trigger element that is electrically connected to a gate of the thyristor element, and causes the thyristor element to operate.

2. The electrostatic protection circuit according to claim 1, further comprising:

a resistive element whose one end is electrically connected to the connection terminal, and whose other end is electrically connected to the internal circuit;

a second diode element whose anode is electrically connected to the other end of the resistive element, and whose cathode is electrically connected to the first terminal; and a third diode element whose anode is electrically connected to the second terminal, and whose cathode is electrically connected to the other end of the resistive element.

3. The electrostatic protection circuit according to claim 1, further comprising:

a resistive element whose one end is electrically connected to the connection terminal;

an NMOS transistor whose drain is electrically connected to another end of the resistive element, whose source is electrically connected to the internal circuit, and whose gate is electrically connected to the first terminal;

a second diode element whose anode is electrically connected to the source of the NMOS transistor, and whose cathode is electrically connected to the first terminal; and a third diode element whose anode is electrically connected to the second terminal, and whose cathode is electrically connected to the other end of the resistive element.

4. The electrostatic protection circuit according to claim 1, further comprising:

a resistive element whose one end is electrically connected to the connection terminal;

a PMOS transistor whose drain is electrically connected to another end of the resistive element, whose source is electrically connected to the internal circuit, and whose gate is electrically connected to the second terminal;

a second diode element whose anode is electrically connected to the source of the PMOS transistor, and whose cathode is electrically connected to the first terminal; and a third diode element whose anode is electrically connected to the second terminal, and whose cathode is electrically connected to the drain of the PMOS transistor.

5. The electrostatic protection circuit according to claim 1, wherein the thyristor element includes:

a first impurity-doped region provided on a substrate, and a second impurity-doped region provided in the first impurity-doped region, the anode of the thyristor element is provided in the first impurity-doped region, and the cathode of the thyristor element is provided in the second impurity-doped region.

6. An electrostatic protection circuit that is electrically connected to a first terminal to which a first voltage signal is input, a second terminal to which a second voltage signal whose potential is lower than that of the first voltage signal is input, and a third terminal to which a third voltage signal whose potential is lower than that of the first voltage signal, and higher than that of the second voltage signal is input, and mitigates the influence of a surge voltage on an internal circuit, wherein the internal circuit is electrically connected to the first terminal and the third terminal, the electrostatic protection circuit includes:

a first protection circuit that is electrically connected to the first terminal and the second terminal, and a second protection circuit that is electrically connected to the first terminal and the third terminal, and the second protection circuit includes:

a first diode element whose anode is electrically connected to the third terminal, and whose cathode is electrically connected to the first terminal, a thyristor element whose cathode is electrically connected to the third terminal, a voltage limiting element that is electrically connected to an anode of the thyristor element, and a trigger element that is electrically connected to a gate of the thyristor element, and causes the thyristor element to operate.

* * * * *